United States Patent [19]
Kamada

[11] Patent Number: 5,671,233
[45] Date of Patent: Sep. 23, 1997

[54] INTEGRATED CIRCUIT INCORPORATING A TEST CIRCUIT

[75] Inventor: Takehiro Kamada, Osaka, Japan

[73] Assignee: Matsushita Electric Industrial Co., Ltd., Osaka, Japan

[21] Appl. No.: 646,564

[22] Filed: May 8, 1996

[30] Foreign Application Priority Data

May 9, 1995 [JP] Japan ................................. 7-110432

[51] Int. Cl.⁶ .................................................. G06F 11/00
[52] U.S. Cl. ..................................................... 371/22.1
[58] Field of Search ................................. 371/22.1, 22.3, 371/28; 324/837, 538, 530, 688

[56] References Cited

U.S. PATENT DOCUMENTS

| | | | |
|---|---|---|---|
| 5,084,874 | 1/1992 | Whetsel, Jr. ........................ | 371/22.3 |
| 5,498,964 | 3/1996 | Kerschner et al. ................... | 324/530 |
| 5,557,209 | 9/1996 | Crook et al. ....................... | 324/537 |

*Primary Examiner*—Vincent P. Canney
*Attorney, Agent, or Firm*—McDermott, Will & Emery

[57] ABSTRACT

Disposed in an integrated circuit is a test circuit having: a plurality of tristate buffers each for supplying, in a test mode, a charging current to a stray capacitance of a corresponding wire on a printed circuit board through a corresponding signal terminal of the integrated circuit; and a plurality of exclusive-OR gates each for supplying a logical signal having a pulse width indicative of a time interval between an input transition time and an output transition time of a corresponding tristate buffer. A difference in capacitance between a state where a signal terminal is being properly electrically connected to a wire on the printed circuit board and a state where the signal terminal is being improperly electrically connected thereto, is converted into a difference in pulse width of a logical signal, based on which a defective soldering of open failure in the signal terminal is detected.

18 Claims, 5 Drawing Sheets

INTEGRATED CIRCUIT INCORPORATING A TEST CIRCUIT

BACKGROUND OF THE INVENTION

The present invention relates to an integrated circuit to be mounted on a printed circuit board (PC board), and more particularly to an integrated circuit incorporating a test circuit for detecting an open failure of a signal terminal of the integrated circuit.

A PC board on which a plurality of integrated circuits of lead insertion type are to be mounted, has a plurality of through-holes which respectively correspond to a plurality of leads (external terminals) of each integrated circuit, and a plurality of printed wires so formed in a pattern as to be electrically connected to the through-holes. The leads of the integrated circuits are inserted in the corresponding through-holes and all the lead insertion portions are soldered, thus providing electrical connection between the leads and the printed wires. However, such a PC board may present a defective soldering such as an open failure, a short failure or the like. The open failure refers to a fault resulting from a shortage of supplied solder or the like, in which a lead and the corresponding printed wire are undesirably electrically opened. The short failure refers to a fault resulting from an excess of supplied solder or the like, in which a plurality of printed wires are undesirably electrically short-circuited. Such a defective soldering may also take place when there are mounted, on a PC board, integrated circuits formed by using another packaging technology such as surface mount technology.

To detect a defective soldering of an integrated circuit on a PC board, an in-circuit tester has conventionally been used. More specifically, a plurality of probe pins of the in-circuit tester are respectively brought into contact with the wires around an integrated circuit to be tested. Test data signals are supplied from probe pins to input terminals of the integrated circuit, signals supplied from the output terminals of the integrated circuit are latched, as test result signals, in the in-circuit tester by another probe pins, and the signals thus latched are compared with expected values. From the result of comparison, it is judged whether or not there is a defective soldering. However, when a number of integrated circuits are mounted in high density on a single PC board and the PC board has multi-layered wires, there are instances where probe pins cannot physically be brought into contact with wires. Thus, the use of such an in-circuit tester is becoming increasingly impossible.

It is thus considered to utilize, for detection of a defective soldering, a boundary scan test (BST) technology disclosed in U.S. Pat. No. 5,084,874 for example. According to the BST technology, a test circuit comprising a plurality of boundary scan cells (BSC) is disposed in each of two integrated circuits electrically connected to each other through a plurality of printed wires on a PC board. The test circuit incorporated in one integrated circuit, supplies test data signals to the printed wires through the corresponding output terminals of this integrated circuit. The signals on the printed wires are latched, as test result signals, in the test circuit incorporated in the other integrated circuit, through the corresponding input terminals thereof. In a certain mode, all the BSCs are connected in series to one another. A scan operation allows the test data signals to be supplied and the test result signals to be observed. By comparing the test result signals with the test data signals, it is judged whether or not there is a defective soldering.

However, the detection of a defective soldering using a BST technology of prior art is premised based on the fact that each of two integrated circuits electrically connected to each other on a PC board, incorporates a test circuit comprising a plurality of BSCs. Accordingly, if one integrated circuit does not incorporate a test circuit, a defective soldering cannot disadvantageously be detected even though the other integrated circuit incorporates a test circuit. Further, there are instances where a signal terminal of an integrated circuit is connected to a discrete active element such as a transistor, a diode or the like or a passive element such as a transformer, a capacitor or the like which cannot incorporate a test circuit. In such a case, even though the integrated circuit incorporates a test circuit, a defective soldering in a signal terminal of the integrated circuit cannot be detected. Accordingly, it has not been expected to detect, with a high performance, defective solderings on a whole PC board.

SUMMARY OF THE INVENTION

It is an object of the present invention to provide an integrated circuit incorporating a test circuit arranged such that an open failure of a signal terminal of the integrated circuit can be detected only by the test circuit incorporated therein regardless of the elements to which the integrated circuit is electrically connected on a PC board.

To achieve the object above-mentioned, the present invention is arranged to detect an open failure of a signal terminal of an integrated circuit based on a difference between the load capacitance of the signal terminal as properly electrically connected to a printed wire on a PC board and the load capacitance of the signal terminal as improperly electrically connected thereto.

Examples of a quantity indicative of the electric characteristics of a wire, include resistance, inductance and stray capacitance. Of these, the stray capacitance may preferably be selected because of easiness of measurement. The relationship between a charging current I(t) and a charging voltage V(t) when charging the stray capacitance C of a wire, is expressed according to the following equation:

$$I(t)=C \times dV(t)/dt$$

wherein t is time. Accordingly, a difference in stray capacitance can be detected in terms of a difference in charging time, a difference in charging current or a difference in charging voltage. Of these, a difference in charging time may preferably be selected because of easiness of measurement. Thus, provision is made to detect an open failure of a signal terminal based on a difference in time required for charging the stray capacitance.

More specifically, there are disposed, in an integrated circuit, a plurality of tristate buffers each for supplying, in a test mode, a charging current to the stray capacitance of the corresponding wire on a PC board through the corresponding signal terminal. The signal delay time of each of the plurality of tristate buffers reflects a difference in stray capacitance. Accordingly, there are disposed, in the integrated circuit, a plurality of exclusive-OR gates each for supplying a logical signal having a pulse width indicative of the time interval between the input transition time and output transition time of the corresponding tristate buffer. According to the arrangement above-mentioned, an open failure can be detected regardless of the elements on the PC board to which the integrated circuit is connected. This advantageously produces the effect of detecting, with a high performance, defective solderings on the whole PC board.

DETAILED DESCRIPTION OF THE INVENTION

With reference to the attached drawings, the following description will discuss specific examples of an integrated circuit incorporating a test circuit according to the present invention.

Figure 1:
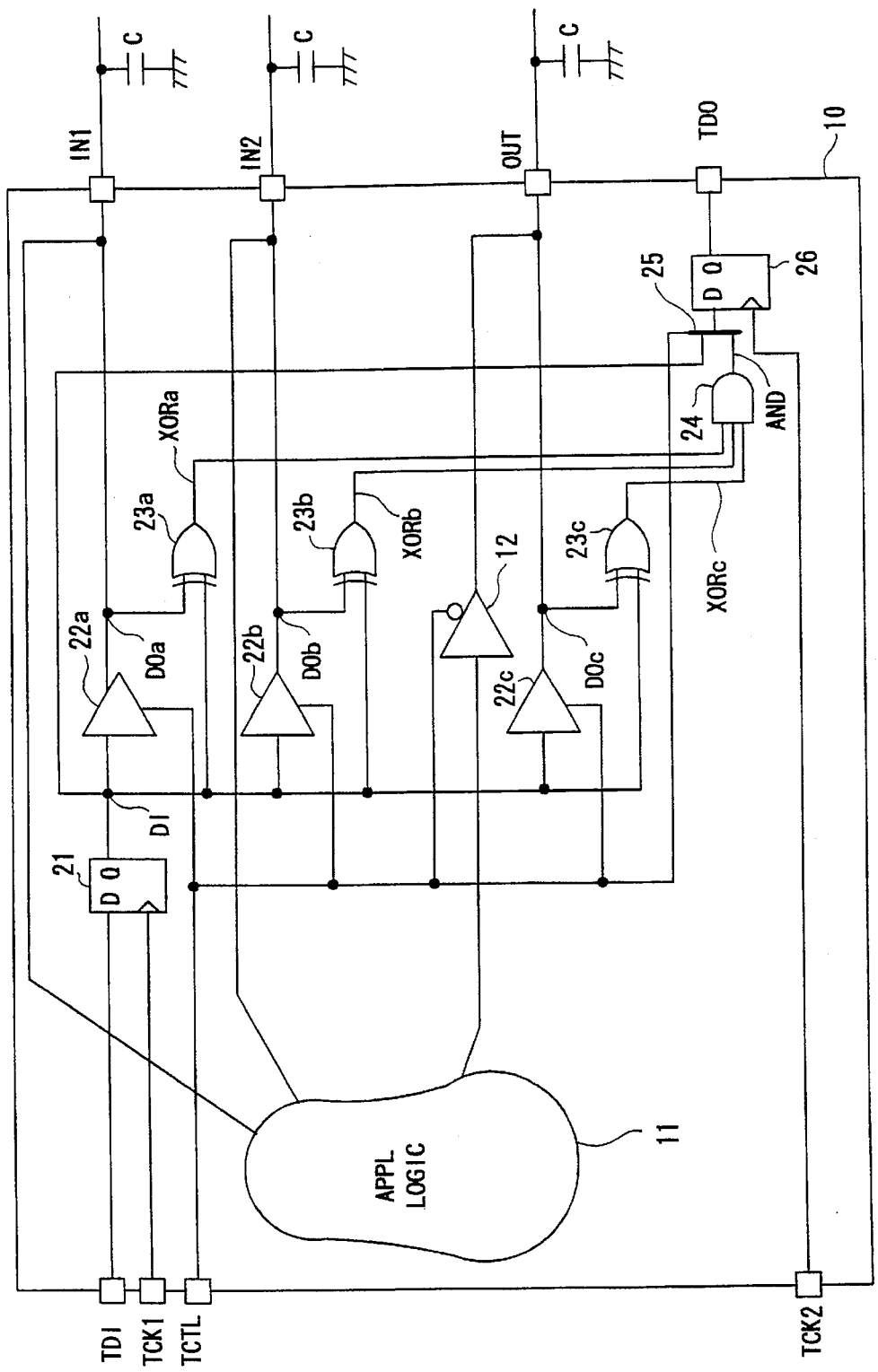
FIG. 1 is a circuit diagram illustrating an example of the arrangement of an integrated circuit according to the present invention.

FIG. 1 shows an example of the arrangement of an integrated circuit 10 according to the present invention. In FIG. 1, the integrated circuit 10 has first and second input terminals IN1, IN2, one output terminal OUT, and five test terminals TDI, TDO, TCTL, TCK1, TCK2. When the integrated circuit 10 is mounted on a PC board, the three signal terminals IN1, IN2, OUT are electrically connected to the corresponding wires on the PC board by soldering. In FIG. 1, C is the stray capacitance of each wire. Also shown in FIG. 1 is an application logic 11 internally connected to the three terminals IN1, IN2, OUT for achieving the original function of the integrated circuit 10. Interposed between the application logic 11 and the output terminal OUT is a tristate buffer 12 for maintaining a high impedance output when a test control signal TCTL designates a test mode (TCTL=1), and for transmitting a signal to the output terminal OUT from the application logic 11 when the test control signal TCTL designates a non-test mode (TCTL=0). In the example in FIG. 1, the number of the signal terminals is set to three for purposes of illustration, but this number is not limited to three.

A test circuit incorporated in the integrated circuit 10 in FIG. 1, has first and second D-type flip-flops 21, 26, first, second and third tristate buffers 22a, 22b, 22c, first, second and third exclusive-OR gates 23a, 23b, 23c, one AND gate 24 and one selector 25.

The first D-type flip-flop 21 is an input flip-flop for latching a test data signal TD1 in synchronism with the rise transition of a first test clock signal TCK1 and for distributing the signal thus latched to the three tristate buffers 22a, 22b, 22c. Shown in FIG. 1 is a common input signal DI entered into the three tristate buffers 22a, 22b, 22c.

The first tristate buffer 22a supplies a signal DOa to the first input terminal IN1, the second tristate buffer 22b supplies a signal DOb to the second input terminal IN2, and the third tristate buffer 22c supplies a signal DOc to the output terminal OUT. When the test control signal TCTL designates a test mode (TCTL=1), each of the first, second and third tristate buffers 22a, 22b, 22c supplies a weak charging current to the stray capacitance C of the corresponding wire on the PC board through each of the first input terminal IN1, the second input terminal IN2 and the output terminal OUT. When the test control signal TCTL designates a non-test mode (TCTL=0), each of the three tristate buffers 22a, 22b, 22c maintains a high-impedance output. The first exclusive-OR gate 23a supplies a logical signal XORa having a pulse width indicative of the time interval between the rise transition time of the input signal DI of the first tristate buffer 22a and the rise transition time of the output signal DOa of the first tristate buffer 22a. The second exclusive-OR gate 23b supplies a logical signal XORb having a pulse width indicative of the time interval between the rise transition time of the input signal DI of the second tristate buffer 22b and the rise transition time of the output signal DOb of the second tristate buffer 22b. The third exclusive-OR gate 23c supplies a logical signal XORc having a pulse width indicative of the time interval between the rise transition time of the input signal DI of the third tristate buffer 22c and the rise transition time of the output signal DOc of the third tristate buffer 22c.

The AND gate 24 is arranged to supply a logical multiplication signal AND of the three logical signals XORa, XORb, XORc. The selector 25 is arranged to supply the logical multiplication signal AND when the test control signal TCTL designates a test mode (TCTL=1), and to supply an output signal of the first D-type flip-flop 21 when the test control signal TCTL designates a non-test mode (TCTL=0), each of these signals being supplied, as a data signal, to the second D-type flip-flop 26. The second D-type flip-flop 26 is an output flip-flop for latching the data signal supplied from the selector 25 in synchronism with the rise transition of a second test clock signal TCK2 and for supplying, as a test result signal TDO, the signal thus latched.

Figure 2:
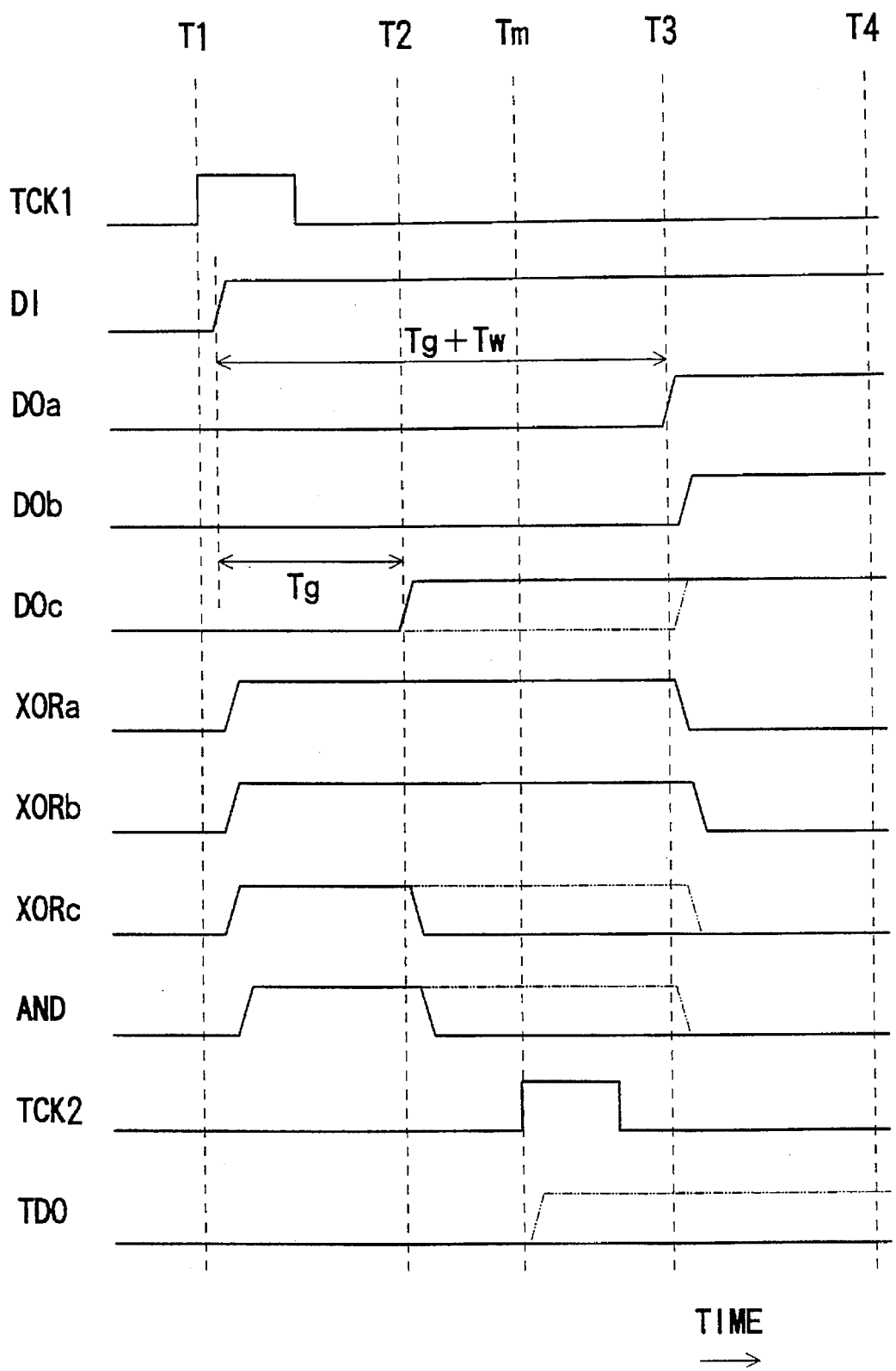
FIG. 2 is a timing chart illustrating the test operation of the integrated circuit in FIG. 1.

FIG. 2 shows the test operation (TCTL=1) of the integrated circuit 10 above-mentioned. It is now supposed that the two input terminals IN1, IN2 are not defective in soldering, but the output terminal OUT has a defective soldering of open failure. When the first test clock signal TCK1 rises at time T1 after the logical value of the test data signal TD1 has been set to 1, the output signal of the first D-type flip-flop 21 changes in logical value from 0 to 1. More specifically, the input signal DI shared with the three tristate buffers 22a, 22b, 22c rises. Since the two input terminals IN1, IN2 are not defective in soldering, each of the first and second tristate buffers 22a, 22b supplies a weak charging current to the corresponding stray capacitance C. The signal delay time in the first tristate buffer 22a is equal to the sum of the gate delay time Tg inherent in the buffer and the wire delay time Tw dependent on the stray capacitance C of the wire. This also applies to the second tristate buffer 22b. On the other hand, since the output terminal OUT has a defective soldering of open failure, the third tristate buffer 22c does not supply a charging current to the stray capacitance C. Accordingly, the signal delay time in the third tristate buffer 22c is equal to the gate delay time Tg inherent in the buffer. More specifically, as shown in FIG. 2, after the output signal DOc of the third tristate buffer 22c has risen at time T2, the output signals DOa, DOb of the first and second tristate buffers 22a, 22b rise at time T3. As a result, each of the logical signals XORa, XORb supplied from the first and second exclusive-OR gates 23a, 23b has a pulse width of Tg+Tw, and the logical signal XORc supplied form the third exclusive-OR gate 23c has a pulse width of Tg. That is, the logical multiplication signal AND supplied form the AND gate 24 has a width length Tg.

The wire delay time Tw is expressed by the following equation:

$$Tw = C \times Tc$$

wherein Tc is a delay time per unit capacitance and is for example set to 10 ns/pF. In such a case, even though the stray capacitance C is equal to 1 pF, there is produced a difference in time as long as 10 ns between the rise transition time T2 of the signal DOc and the rise transition time T3 of the signals DOa, DOb. At time Tm between the times T2 and T3, the second test clock signal TCK2 rises. At the time Tm, the logical value of the logical multiplication signal AND has already become 0. Accordingly, the second D-type flip-flop 26 latches a logical value of 0. As a result, the test result signal TDO presents a logical value 0 indicative of an open failure. This test result signal TDO is observed at time T4. When neither the two input terminals IN1, IN2 nor the output terminal OUT are defective in soldering, the logical value of the test result signal TDO at the time T4 becomes 1 indicative of no open failure, as shown by an imaginary line (a two-dot chain line) in FIG. 2.

As discussed in the foregoing, according to the integrated circuit 10 in FIG. 1, it can be judged only by the test circuit incorporated in the integrated circuit 10 whether or not there is a signal terminal presenting an open failure in the three signal terminals IN1, IN2, OUT. More specifically, there can readily be conducted a so-called GO/NG test relating to a soldering failure of the integrated circuit 10 on the PC board.

Figure 3:
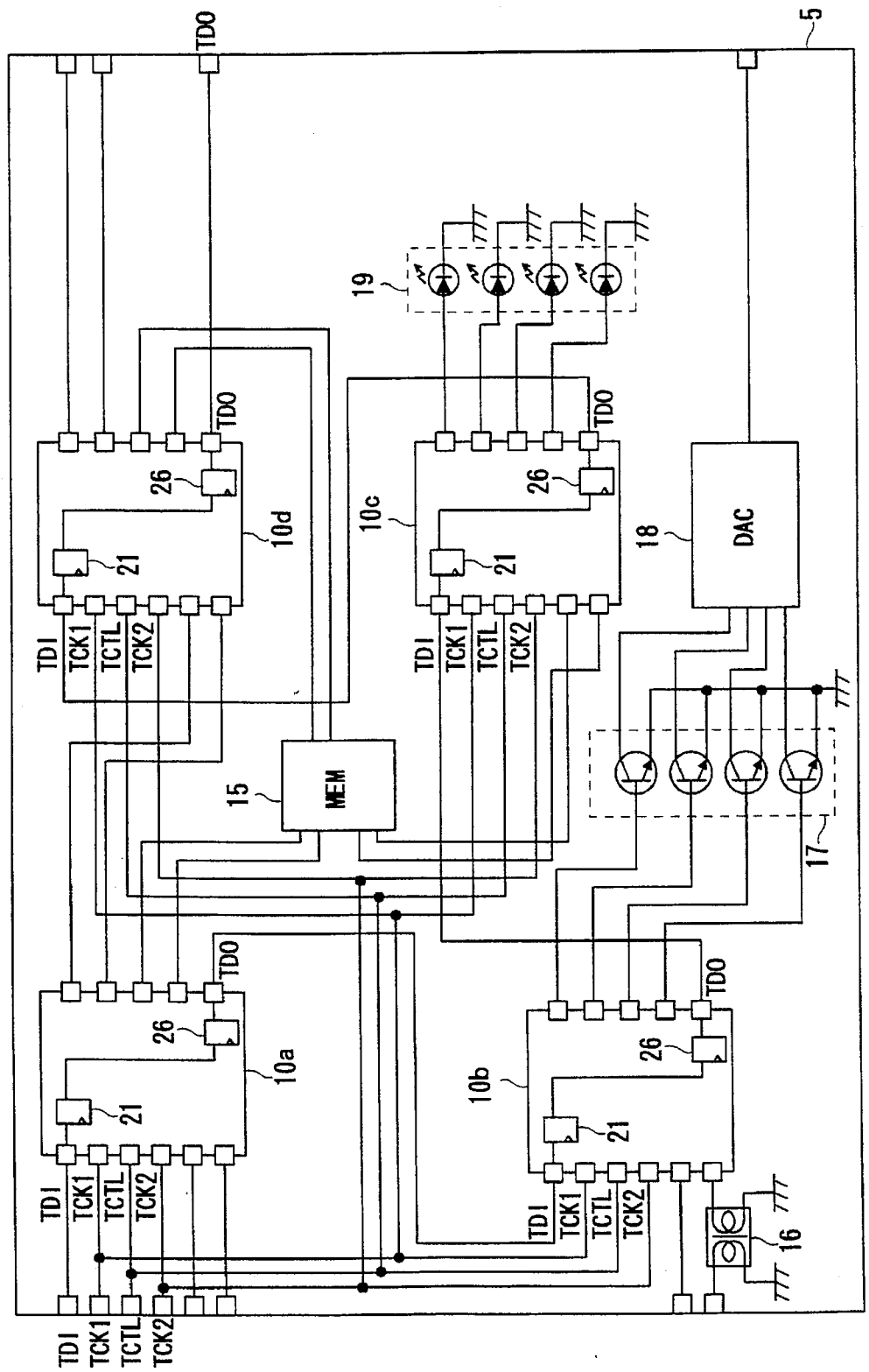
FIG. 3 is a block diagram of an example of a PC board on which mounted are a plurality of circuit elements including four integrated circuits, each incorporating a test circuit, in each of which the arrangement in FIG. 1 is being extended.

FIG. 3 shows an example of a PC board on which mounted are a plurality of circuit elements including four integrated circuits each according to the present invention. Mounted on a PC board 5 in FIG. 3 are first, second, third and fourth integrated circuits 10a, 10b, 10c, 10d in each of which the arrangement in FIG. 1 is being extended and each of which incorporates a test circuit, a memory 15, a transformer 16, transistors 17, a digital/analogue converter (DAC) 18 and light emitting diodes (LEDs) 19. Each of the four integrated circuits 10a, 10b, 10c, 10d has six signal terminals and five test terminals TDI, TDO, TCTL, TCK1, TCK2. The PC board 5 has seven signal terminals and five test terminals TDI, TDO, TCTL, TCK1, TCK2. A test control signal TCTL, a first test clock signal TCK1 and a second test clock signal TCK2 which are externally supplied to the PC board 5, are supplied in parallel to each of the four integrated circuits 10a, 10b, 10c, 10d. When the test control signal TCTL designates a non-test mode (TCTL=0), the selectors 25 (See FIG. 1) operate such that the total eight D-type flip-flops 21, 26 incorporated in the four integrated circuits 10a, 10b, 10c, 10d are connected in series to one another between the test data input terminal TDI and the test result output terminal TDO of the PC board 5 as shown in FIG. 3. Each of the memory 15 and the DAC 18 is an integrated circuit which incorporates no test circuit. Each of the transformer 16, the transistors 17 and the LEDs 19 is an element which cannot incorporate a test circuit.

In the PC board 5 in FIG. 3, there are conducted, by a scan operation (TCTL=0) likewise in the BST technology of prior art, the entry of the test data signals to the four integrated circuits 10a, 10b, 10c, 10d and the observation of the test result signals therefrom. At this time, a unique clock signal is externally supplied as each of the first test clock signal TCK1 and the second test clock signal TCK2. When the test control signal TCTL designating a test mode (TCTL=1) is externally supplied to the PC board 5, there is executed an open failure test based on the stray capacitance of each of the signal terminals of the four integrated circuits 10a, 10b, 10c, 10d. More specifically, two signal terminals of the first integrated circuit 10a, two signal terminals of the third integrated circuit 10c and two signal terminals of the fourth integrated circuit 10d are connected to the memory 15 through printed wires. The memory 15 does not incorporate a test circuit, but these signal terminals can be checked for open failure. Another two signal terminals of the first integrated circuit 10a, one signal terminal of the second integrated circuit 10b and another two signal terminals of the fourth integrated circuit 10d are opened at signal terminals of the PC board 5 through printed wires, but can be checked for open failure. Another one signal terminal of the second integrated circuit 10b is connected to the transformer 16 through a printed wire, another four signal terminals of the second integrated circuit 10b are connected to the bases of the transistors 17 through printed wires, and another four signal terminals of the third integrated circuit 10c are connected to the anodes of the LEDs 19 through printed wires. Each of the transformer 16, the transistors 17 and the LEDs 19 is an element which cannot incorporate a test circuit. However, these signal terminal can also be checked for open failure. Another two signal terminals of the first integrated circuit 10a and another two signal terminals of the fourth integrated circuit 10d are connected to each other through printed wires, but can be checked for open failure. Thus, the arrangement in FIG. 3 is considerably improved, as compared with the BST technology of prior art, in the performance of detecting soldering failures in the whole PC board 5.

Figure 4:
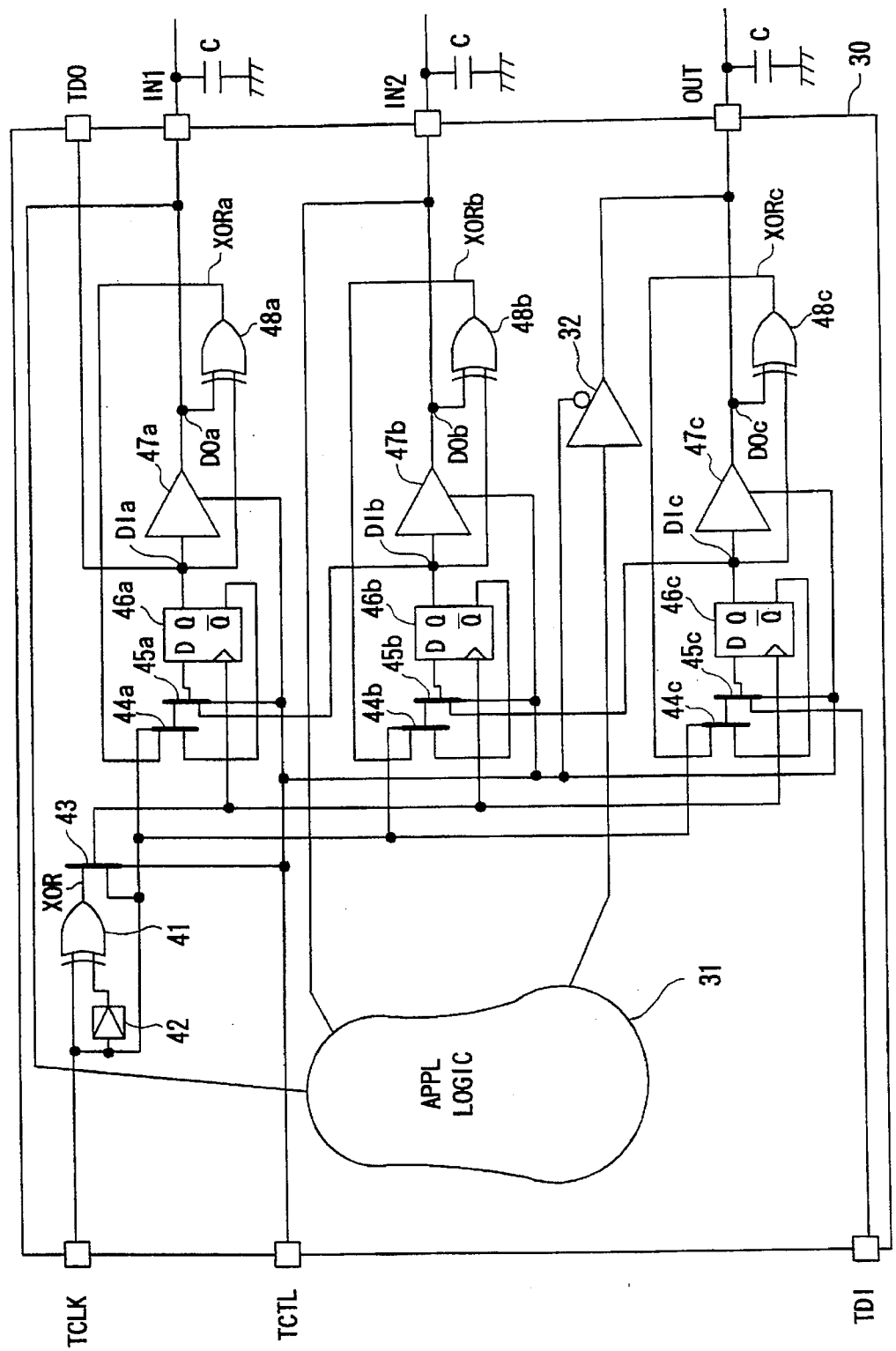
FIG. 4 is a circuit diagram illustrating another example of the arrangement of the integrated circuit according to the present invention.

FIG. 4 shows another example of the integrated circuit according to the present invention. An integrated circuit 30 in FIG. 4 has first and second input terminals IN1, IN2, one output terminal OUT, and four test terminals TDI, TDO, TCTL, TCLK. When the integrated circuit 30 is mounted on a PC board, the three signal terminals IN1, IN2, OUT are electrically connected to the corresponding wires on the PC board by soldering. In FIG. 4, C is the stray capacitance of each wire. Also shown in FIG. 4 is an application logic 31 internally connected to the three signal terminals IN1, IN2, OUT for achieving the original function of the integrated circuit 30. Interposed between the application logic 31 and the output terminal OUT is a tristate buffer 32 for maintaining a high-impedance output when the test control signal TCTL designates a test mode (TCTL=1), and for transmitting a signal to the output terminal OUT from the application logic 31 when the test control signal TCTL designates a non-test mode (TCTL=0). In the example in FIG. 4, the number of signal terminals is set to three for purposes of illustration, but this number is not limited to three.

A test circuit incorporated in the integrated circuit 30 in FIG. 4, has a first exclusive-OR gate 41, a delay circuit 42, a first selector 43, second, third and fourth selectors 44a, 44b, 44c, fifth, sixth and seventh selectors 45a, 45b, 45c, first, second and third D-type flip-flops 46a, 46b, 46c, first, second and third tristate buffers 47a, 47b, 47c, and second, third and fourth exclusive-OR gates 48a, 48b, 48c.

The delay circuit 42 is arranged to delay an externally supplied test clock signal TCLK by a predetermined period of time ΔT. The first exclusive-OR gate 41 is arranged to supply, as an internal clock signal XOR, an exclusive logical sum signal of the test clock signal TCLK and an output signal of the delay circuit 42. The first selector 43 is arranged to supply, to the three D-type flip-flops 46a, 46b, 46c, the internal clock signal XOR supplied from the first exclusive-OR gate 41 when the test control signal TCTL designates a test mode (TCTL=1), and the externally supplied test clock signal TCLK when the test control signal TCTL designates a non-test mode (TCTL=0).

The second selector 44a is arranged to select, as a self-generated test data signal, an inverted output signal of the first D-type flip-flop 46a when the logical value of the test clock signal TCLK is 0, and a logical signal XORa supplied from the second exclusive-OR gate 48a when the logical value of the test clock signal TCLK is 1. The fifth selector 45a is arranged to supply the signal selected by the second selector 44a when the test control signal TCTL designates a test mode (TCTL=1), and a non-inverted output signal of the second D-type flip-flop 46b when the test control signal TCTL designates a non-test mode (TCTL=0), each of these signals being supplied, as a data signal, to the first D-type flip-flop 46a. The first D-type flip-flop 46a is arranged to latch the data signal supplied from the fifth selector 45a in synchronism with the rise transition of a clock signal supplied from the first selector 43 and to supply the signal thus latched to the first tristate buffer 47a. A non-inverted output of the first D-type flip-flop 46a is connected to the test result output terminal TDO.

The third selector 44b is arranged to select, as a self-generated test data signal, an inverted output signal of the second D-type flip-flop 46b when the logical value of the test clock signal TCLK is 0, and a logical signal XORb supplied from the third exclusive-OR gate 48b when the logical value of the test clock signal TCLK is 1. The sixth selector 45b is arranged to supply the signal selected by the third selector 44b when the test control signal TCTL designates a test mode (TCTL=1), and a non-inverted output signal of the third D-type flip-flop 46c when the test control signal TCTL designates a non-test mode (TCTL=0), each of these signals being supplied, as a data signal, to the second D-type flip-flop 46b. The second D-type flip-flop 46b is arranged to latch a data signal supplied from the sixth selector 45b in synchronism with the rise transition of a clock signal supplied from the first selector 43 and to supply the signal thus latched to the second tristate buffer 47b.

The fourth selector 44c is arranged to select, as a self-generated test data signal, an inverted output signal of the third D-type flip-flop 46c when the logical value of the test clock signal TCLK is 0, and a logical signal XORc supplied from the fourth exclusive-OR gate 48c when the logical value of the test clock signal TCLK is 1. The seventh selector 45c is arranged to supply the signal selected by the fourth selector 44c when the test control signal TCTL designates a test mode (TCTL=1), and a signal externally supplied through the test data input terminal TDI when the test control signal TCTL designates a non-test mode (TCTL=0), each of these signals being supplied, as a data signal, to the third D-type flip-flop 46c. The third D-type flip-flop 46c is arranged to latch a data signal supplied from the seventh selector 45c in synchronism with the rise transition of a clock signal supplied from the first selector 43 and to supply the signal thus latched to the third tristate buffer 47c.

The first tristate buffer 47a is arranged to supply a signal DOa to the first input terminal IN1, the second tristate buffer 47b is arranged to supply a signal DOb to the second input terminal IN2, and the third tristate buffer 47c is arranged to supply a signal DOc to the output terminal OUT. When the test control signal TCTL designates a test mode (TCTL=1), the first, second, third tristate buffers 47a, 47b, 47c respectively supply weak charging currents to the stray capacitances C of the corresponding wires on the PC board through the first input terminal IN1, the second input terminal IN2 and the output terminal OUT, respectively. When the test control signal TCTL designates a non-test mode (TCTL=0), each of the three tristate buffers 47a, 47b, 47c maintains a high-impedance output.

The second exclusive-OR gate 48a supplies a logical signal XORa having a pulse width indicative of the time interval between the rise transition time of an input signal DIa of the first tristate buffer 47a and the rise transition time of an output signal DOa of the first tristate buffer 47a. The third exclusive-OR gate 48b supplies a logical signal XORb having a pulse width indicative of the time interval between the rise transition time of an input signal DIb of the second tristate buffer 47b and the rise transition time of an output signal DOb of the second tristate buffer 47b. The fourth exclusive-OR gate 48c supplies a logical signal XORc having a pulse width indicative of the time interval between the rise transition time of an input signal DIc of the third tristate buffer 47c and the rise transition time of an output signal DOc of the third tristate buffer 47c.

In the integrated circuit 30 in FIG. 4, there are conducted, by a scan operation (TCTL=0) likewise in the BST technology of prior art, the entry of the test data signals to the three D-type flip-flops 46a, 46b, 46c and the observation of the test result signals latched thereby. More specifically, when the test control signal TCTL designates a non-test mode (TCTL=0), there is formed a scan path from the test data input terminal TDI to the test result output terminal TDO through the seventh selector 45c, the third D-type flip-flop 46c, the sixth selector 45b, the second D-type flip-flop 46b, the fifth selector 45a and the first D-type flip-flop 46a. Further, the externally supplied test clock signal TCLK is supplied, as a data shifting clock signal, to each of the three D-type flip-flops 46a, 46b, 46c.

Figure 5:
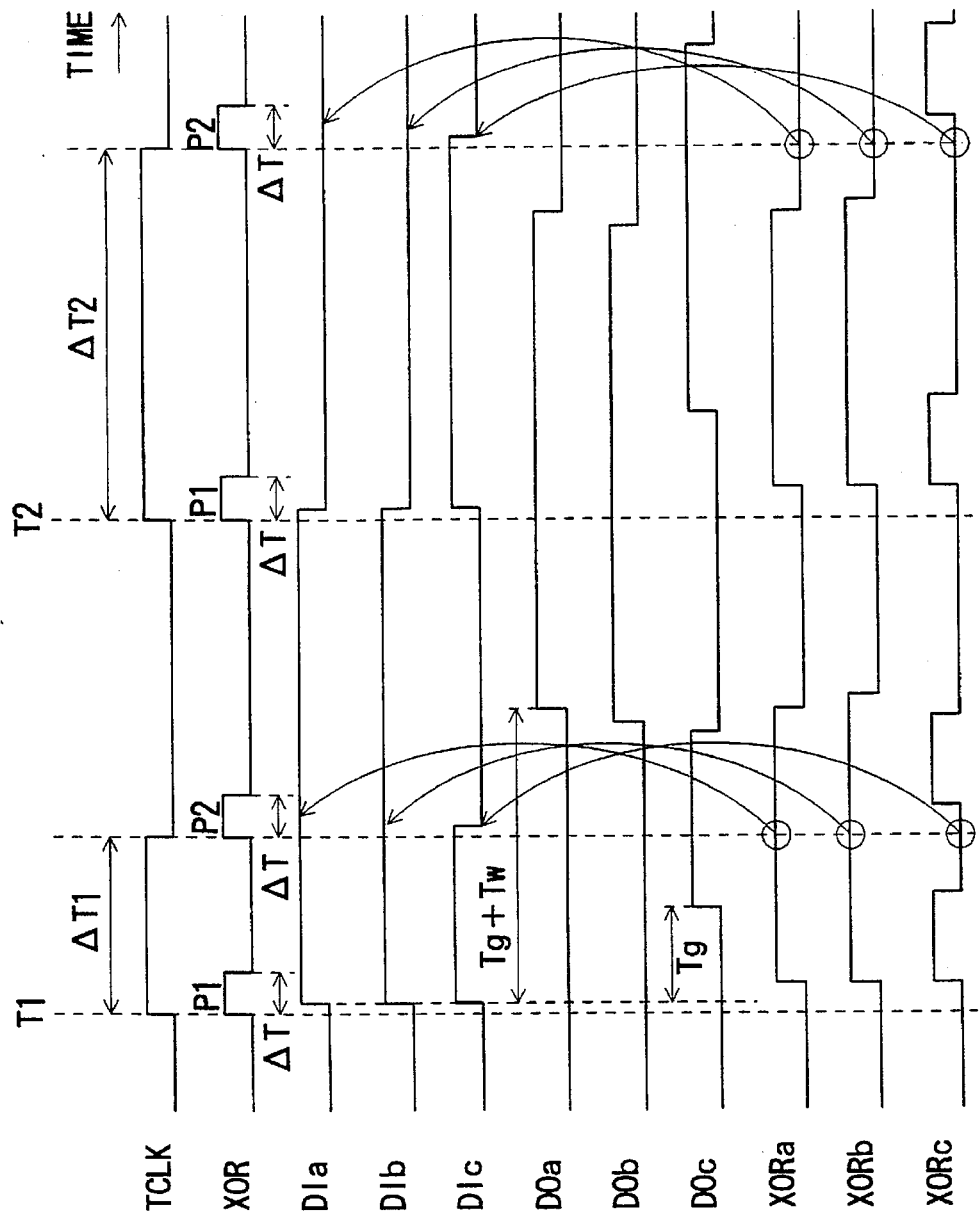
FIG. 5 is a timing chart illustrating the test operation of the integrated circuit in FIG. 4.

FIG. 5 shows the test operation (TCTL=1) of the integrated circuit 30. It is now supposed that the two input terminals IN1, IN2 are not defective in soldering, but the output terminal OUT has a defective soldering of open failure. Further, it is supposed that the logical values of non-inverted output signals of the three D-type flip-flops 46a, 46b, 46c have previously been set to 0 by a scan operation (TCTL=0). Accordingly, while the logical value of the test clock signal TCLK is 0, the inverted output signals of the three D-type flip-flops 46a, 46b, 46c are respectively supplied to the three D-type flip-flops 46a, 46b, 46c as self-generated test data signals of which logical values are equal to 1.

The first exclusive-OR gate 41 and the delay circuit 42 generate an internal clock signal XOR from the test clock signal TCLK. As shown in FIG. 5, the generated internal clock signal XOR has a pulse P1 having a width $\Delta T$ starting from the rise transition time of the test clock signal TCLK and a pulse P2 having a width $\Delta T$ starting from the fall transition time of the test clock signal TCLK.

When the test clock signal TCLK rises at time T1, each of the non-inverted output signals of the three D-type flip-flops 46a, 46b, 46c changes in logical value from 0 to 1 in synchronism with the rise transition of the pulse P1 of the internal clock signal XOR. That is, the input signals DIa, DIb, DIc of the three tristate buffers 47a, 47b, 47c rise. Since the two input terminals IN1, IN2 are not defective in soldering, each of the first and second tristate buffers 47a, 47b supplies a weak charging current to the corresponding stray capacitance C. The signal delay time in the first tristate buffer 47a is equal to the sum of the gate delay time Tg inherent in the buffer and the wire delay time Tw dependent on the stray capacitance C of the wire. This also applies to the second tristate buffer 47b. On the other hand, since the output terminal OUT has a defective soldering of an open failure, the third tristate buffer 47c does not supply a charging current to the stray capacitance C. Accordingly, the signal delay time in the third tristate buffer 47c is equal to the gate delay time Tg inherent in the buffer. More specifically, as shown in FIG. 5, after the output signal DOc of the third tristate buffer 47c has risen, the output signals DOa, DOb of the first and second tristate buffers 47a, 47b rise. As a result, each of the logical signals XORa, XORb supplied from the first and second exclusive-OR gates 48a, 48b has a pulse width Tg+Tw, and the logical signal XORc supplied form the third exclusive-OR gate 48c has a pulse width Tg.

When the test clock signal TCLK falls at the point of time where a period of time ΔT1 has passed from time T1, the three logical signals XORa, XORb, XORc are respectively latched by the D-type flip-flops 46a, 46b, 46c. Here, the following relationships are established:

$$Tg < \Delta T1 < Tg + Tw$$

Accordingly, the logical value of the signal DIa becomes 1 indicative of no open failure, the logical value of the signal DIb becomes 1 indicative of no open failure, and the logical value of the signal DIc becomes 0 indicative of an open failure. These signals DIa, DIb, DIc are observed through the test result output terminal TDO by a scan operation (TCTL=0). As shown in FIG. 5, when the test clock signal TCLK again rises at time T2 and then falls at the point of time where a period of time ΔT2 has further passed, the logical values of the signals DIa, DIb, DIc are returned to 0. Here, the following relationship is established:

$$Tg + Tw < \Delta T2$$

As discussed in the foregoing, according to the integrated circuit 30 in FIG. 4, it is possible to specify, only by the test circuit incorporated in the integrated circuit 30, a signal terminal presenting an open failure out of the three signal terminals IN1, IN2, OUT. This advantageously facilitates the repair of a signal terminal presenting an open failure. Further, each of the three D-type flip-flops 46a, 46b, 46c has not only a function of an input flip-flop for entering a test data signal, but also a function of an output flip-flop for supplying a test result signal. This reduces the test circuit in size. Further, provision is made such that the first exclusive-OR gate 41 and the delay circuit 42 generate an internal clock signal XOR having a pulse P1 for latching a test data signal and a pulse P2 for latching a test result signal. Therefore, it is advantageously sufficient to externally supply only one test clock signal TCLK.

Each of the examples in FIGS. 1 and 4 is arranged to conduct the entry of a test data signal and the observation of a test result signal by a scan operation likewise in a BST technology of prior art. However, the present invention is not limited to the foregoing. Further, the present invention can be applied not only to a digital integrated circuit, but also to an analog integrated circuit.

What is claimed is:

1. An integrated circuit to be mounted on a printed circuit board, comprising:
   a plurality of signal terminals to be electrically connected to wires on said printed circuit board;
   first circuit means for charging, through said plurality of signal terminals, stray capacitances of said wires on said printed circuit board; and
   second circuit means for checking said plurality of signal terminals for proper electrical connection to said wires on said printed circuit board, based on a difference in stray capacitances charged by said first circuit means.

2. An integrated circuit according to claim 1, wherein said first circuit means comprises a plurality of tristate buffers each for supplying a charging current to stray capacitance of a corresponding wire on said printed circuit board through a corresponding signal terminal out of said plurality of signal terminals when an externally supplied test control signal designates a test mode, and for maintaining a high-impedance output when said test control signal designates a non-test mode.

3. An integrated circuit according to claim 1, further comprising:
   internal circuit means internally connected to said plurality of signal terminals for achieving an original function of said integrated circuit; and
   a tristate buffer interposed between said internal circuit means and an output terminal out of said plurality of signal terminals for maintaining a high-impedance output when an externally supplied test control signal designates a test mode, and for transmitting a signal from said internal circuit means to said output terminal when said test control signal designates a non-test mode.

4. An integrated circuit according to claim 1, wherein said second circuit means comprises means for detecting a defective soldering of open failure in a signal terminal out of said plurality of signal terminals, based on a difference in time required for charging said stray capacitances.

5. An integrated circuit according to claim 1, wherein said second circuit means comprises means for supplying a signal indicative of the presence or absence, in said plurality of signal terminals, of a signal terminal which presents a defective soldering of open failure.

6. An integrated circuit according to claim 1, wherein said second circuit means comprises means for supplying a signal which specifies, out of said plurality of signal terminals, a signal terminal which presents a defective soldering of open failure.

7. An integrated circuit according to claim 2, further comprising an input flip-flop for latching a test data signal, and for distributing the test data signal thus latched to each of said plurality of tristate buffers.

8. An integrated circuit according to claim 2, further comprising a plurality of input flip-flops each for latching a corresponding test data signal, and for supplying the test data signal thus latched to a corresponding tristate buffer out of said plurality of tristate buffers.

9. An integrated circuit according to claim 2, wherein said second circuit means comprises a plurality of logical gates each for supplying a logical signal having a pulse width indicative of a time interval between an input transition time of a corresponding tristate buffer out of said plurality of tristate buffers, and an output transition time of said corresponding tristate buffer.

10. An integrated circuit according to claim 9, wherein said second circuit means further comprises:
    an AND gate for supplying a logical multiplication signal of said logical signals supplied from said plurality of logical gates; and
    an output flip-flop for latching said logical multiplication signal supplied from said AND gate, and for externally supplying the logic multiplication signal thus latched.

11. An integrated circuit according to claim 9, wherein said second circuit means further comprises a plurality of output flip-flops each for latching a logical signal supplied from a corresponding logical gate out of said plurality of logical gates, and for externally supplying the logical signal thus latched.

12. An integrated circuit to be mounted on a printed circuit board comprising:
    a plurality of signal terminals to be electrically connected to wires on said printed circuit board;
    a plurality of tristate buffers each for supplying a charging current to a stray capacitance of a corresponding wire on said printed circuit board through a corresponding signal terminal out of said plurality of signal terminals when an externally supplied test control signal designates a test mode, and for maintaining a high-impedance output when said test control signal designates a non-test mode;

an input flip-flop for latching a test data signal in synchronism with a first test clock signal, and for distributing the test data signal thus latched to each of said plurality of tristate buffers;

a plurality of logical gates each for supplying a logical signal having a pulse width indicative of a time interval between an input transition time of a corresponding tristate buffer out of said plurality of tristate buffers, and an output transition time of said corresponding tristate buffer;

an AND gate for supplying a logical multiplication signal of said logical signals supplied from said plurality of logical gates; and an output flip-flop for latching said logical multiplication signal supplied from said AND gate in synchronism with a second test clock signal, and for externally supplying the logical multiplication signal thus latched.

13. An integrated circuit according to claim 12, further comprising:

internal circuit means internally connected to said plurality of signal terminals for achieving an original function of said integrated circuit; and a tristate buffer interposed between said internal circuit means and an output terminal out of said plurality of signal terminals for maintaining a high-impedance output when said test control signal designates a test mode, and for transmitting a signal from said internal circuit means to said output terminal when said test control signal designates a non-test mode.

14. An integrated circuit according to claim 12, further comprising circuit means for connecting, in series, said input flip-flop and said output flip-flop to each other when said test control signal designates a non-test mode.

15. An integrated circuit to be mounted on a printed circuit board comprising:

a plurality of signal terminals to be electrically connected to wires on said printed circuit board;

a plurality of tristate buffers each for supplying a charging current to a stray capacitance of a corresponding wire on said printed circuit board through a corresponding signal terminal out of said plurality of signal terminals when an externally supplied test control signal designates a test mode, and for maintaining a high-impedance output when said test control signal designates a non-test mode;

a plurality of logical gates each for supplying a logical signal having a pulse width indicative of a time interval between an input transition time of a corresponding tristate buffer out of said plurality of tristate buffers, and an output transition time of said corresponding tristate buffer; a delay circuit for delaying an externally supplied test clock signal;

an exclusive-OR gate for supplying, as an internal clock signal, an exclusive logical sum signal of said test clock signal and an output signal of said delay circuit;

a plurality of selectors each for selecting, according to a logical value of said test clock signal, either the logical signal supplied from a corresponding logical gate out of said plurality of logical gates or a self-generated test data signal; and a plurality of flip-flops each for latching, in synchronism with said internal clock signal supplied from said exclusive-OR gate, a signal selected by a corresponding selector out of said plurality of selectors, and for supplying said latched signal to a corresponding tristate buffer out of said plurality of tristate buffers.

16. An integrated circuit according to claim 15, further comprising:

internal circuit means internally connected to said plurality of signal terminals for achieving an original function of said integrated circuit; and a tristate buffer interposed between said internal circuit means and an output terminal out of said plurality of signal terminals for maintaining a high-impedance output when said test control signal designates a test mode, and for transmitting a signal from said internal circuit means to said output terminal when said test control signal designates a non-test mode.

17. An integrated circuit according to claim 15, wherein each of said plurality of flip-flops further has a function of supplying, as said self-generated test data signal, an inverted signal of said latched signal to a corresponding selector out of said plurality of selectors.

18. An integrated circuit according to claim 15, further comprising circuit means for connecting in series said plurality of flip-flops to one another when said test control signal designates a non-test mode.

* * * * *